(12) United States Patent
Wang et al.

(10) Patent No.: US 12,237,340 B2
(45) Date of Patent: Feb. 25, 2025

(54) DISPLAY SUBSTRATE, DISPLAY PANEL AND DISPLAY APPARATUS

(71) Applicant: BOE Technology Group Co., Ltd., Beijing (CN)

(72) Inventors: Lizhong Wang, Beijing (CN); Jin Yang, Beijing (CN); Tianmin Zhou, Beijing (CN); Hui Guo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/026,508

(22) PCT Filed: Jun. 23, 2022

(86) PCT No.: PCT/CN2022/100677
§ 371 (c)(1),
(2) Date: Mar. 15, 2023

(87) PCT Pub. No.: WO2023/245538
PCT Pub. Date: Dec. 28, 2023

(65) Prior Publication Data
US 2024/0297177 A1 Sep. 5, 2024

(51) Int. Cl.
*G02F 1/1335* (2006.01)
*G02F 1/1343* (2006.01)
*G02F 1/1362* (2006.01)
*G02F 1/1368* (2006.01)
*H01L 27/12* (2006.01)

(52) U.S. Cl.
CPC ...... *H01L 27/124* (2013.01); *G02F 1/134309* (2013.01); *G02F 1/136286* (2013.01); *G02F 1/1368* (2013.01); *H01L 27/1248* (2013.01)

(58) Field of Classification Search
CPC ..................................................... G02F 1/1335
See application file for complete search history.

(56) References Cited

U.S. PATENT DOCUMENTS

| | | | | |
|---|---|---|---|---|
| 2007/0272928 | A1* | 11/2007 | Park | H01L 29/78675 438/151 |
| 2009/0147168 | A1* | 6/2009 | Lu | H01L 27/1288 257/E21.414 |
| 2012/0154728 | A1* | 6/2012 | Oh | G02F 1/1343 438/30 |
| 2017/0045771 | A1* | 2/2017 | Choi | G02F 1/1368 |
| 2018/0204856 | A1* | 7/2018 | Noh | G02F 1/136286 |
| 2020/0243566 | A1* | 7/2020 | Liu | H01L 27/1218 |

(Continued)

FOREIGN PATENT DOCUMENTS

| | | |
|---|---|---|
| CN | 1848433 A | 10/2006 |
| CN | 107861303 A | 3/2018 |

(Continued)

*Primary Examiner* — Sang V Nguyen
(74) *Attorney, Agent, or Firm* — IPro, PLLC

(57) ABSTRACT

The present disclosure provides a display substrate, a display panel and a display apparatus. The display substrate includes a base substrate; a transistor, located on the base substrate, and including an active layer; and a data line, located between the active layer and the base substrate; the data line is connected with the active layer, and an orthographic projection of the active layer on the base substrate is located in an orthographic projection of the data line on the base substrate.

17 Claims, 11 Drawing Sheets

(56) References Cited

U.S. PATENT DOCUMENTS

| | | | |
|---|---|---|---|
| 2021/0181554 | A1 | 6/2021 | Hong et al. |
| 2022/0140043 | A1 | 5/2022 | Cao et al. |
| 2023/0099934 | A1 | 3/2023 | Gong et al. |
| 2023/0352489 | A1* | 11/2023 | Zhang ................ H01L 27/1222 |

FOREIGN PATENT DOCUMENTS

| | | | | |
|---|---|---|---|---|
| CN | 112289841 | A | 1/2021 | |
| CN | 112736094 | A | 4/2021 | |
| CN | 112992920 | A | 6/2021 | |
| CN | 111725324 | B | 11/2021 | |
| CN | 113690256 | A | 11/2021 | |
| CN | 113745246 | A | 12/2021 | |
| CN | 114582895 | * | 6/2022 | ............. H01L 27/12 |
| CN | 114582895 | A | 6/2022 | |

* cited by examiner

DISPLAY SUBSTRATE, DISPLAY PANEL AND DISPLAY APPARATUS

CROSS REFERENCE TO RELATED APPLICATIONS

The present disclosure is a national phase entry under 35 U.S.C § 371 of International Application No. PCT/CN2022/100677, filed Jun. 23, 2022, and entitled "DISPLAY SUBSTRATE, DISPLAY PANEL AND DISPLAY APPARATUS".

FIELD

The present disclosure relates to the field of display, in particular to a display substrate, a display panel and a display apparatus.

BACKGROUND

A liquid crystal display (LCD) has the advantages of light weight, low power consumption, high image quality, low radiation, portability and the like, and has gradually replaced a traditional cathode ray tube (CRT) display to be widely applied in a modem information device, such as a virtual reality (VR) head-mounted display device, a notebook computer, a television, a mobile phone and a digital product.

SUMMARY

A display substrate, a display panel and a display apparatus provided by embodiments of the present disclosure have the following solutions.

On the one hand, the embodiments of the present disclosure provide a display substrate, including:
- a base substrate;
- a transistor, located on the base substrate, and including an active layer; and
- a data line, located between the active layer and the base substrate; the data line is connected with the active layer, and an orthographic projection of the active layer on the base substrate is located in an orthographic projection of the data line on the base substrate.

In some embodiments, the above display substrate provided by the embodiments of the present disclosure further includes a transfer electrode, a planarization layer and a first electrode which are arranged sequentially on a side of a layer where the transistor is located away from the base substrate, the planarization layer includes a first via hole, the first electrode is connected with the transfer electrode through the first via hole, the transfer electrode is connected with the active layer, and a material of the transfer electrode includes a metal material.

In some embodiments, in the above display substrate provided by the embodiments of the present disclosure, the data line has a widening part at a position corresponding to the first via hole, and an orthographic projection of the widening part on the base substrate covers an orthographic projection of the first via hole on the base substrate.

In some embodiments, in the above display substrate provided by the embodiments of the present disclosure, a distance between a boundary of the orthographic projection of the first via hole on the base substrate and a boundary of the orthographic projection of the widening part on the base substrate is greater than or equal to 0 and less than or equal to 3 µm.

In some embodiments, in the above display substrate provided by the embodiments of the present disclosure, in a direction perpendicular to the data line, a distance of the widening part beyond the data line on one side is greater than or equal to 0.5 µm and less than or equal to 1.5 µm.

In some embodiments, the above display substrate provided by the embodiments of the present disclosure further includes a gate line located on a side of the active layer away from a layer where the data line is located, and in an extension direction of the data line, a distance between the orthographic projection of the widening part on the base substrate and an orthographic projection of the gate line on the base substrate is greater than or equal to 0.3 µm and less than or equal to 1 µm.

In some embodiments, in the above display substrate provided by the embodiments of the present disclosure, an orthographic projection of the transfer electrode on the base substrate covers an orthographic projection of the first via hole on the base substrate.

In some embodiments, in the above display substrate provided by the embodiments of the present disclosure, the transistor includes a gate located on a side of the active layer away from the layer where the data line is located, and an orthographic projection of the gate on the base substrate and the orthographic projection of the first via hole on the base substrate do not overlap each other.

In some embodiments, in the above display substrate provided by the embodiments of the present disclosure, the transistor includes a gate located on a side of the active layer away from the layer where the data line is located, and an orthographic projection of the gate on the base substrate partially overlaps with the orthographic projection of the first via hole on the base substrate.

In some embodiments, the above display substrate provided by the embodiments of the present disclosure further includes the gate line located on a side of the active layer away from the layer where the data line is located, the gate includes a first gate and a second gate, the first gate is multiplexed with the gate line, and the second gate and the gate line intersect and are arranged integrally.

In some embodiments, in the above display substrate provided by the embodiments of the present disclosure, an included angle between the second gate and the gate line is an acute angle.

In some embodiments, in the above display substrate provided by the embodiments of the present disclosure, the second gate includes a first sub-gate and a second sub-gate, the first sub-gate connects the second sub-gate with the gate line, an included angle between the first sub-gate and the gate line is greater than 0° and less than or equal to 90°, and the second sub-gate and the gate line are arranged parallelly.

In some embodiments, in the above display substrate provided by the embodiments of the present disclosure, a line width of the first sub-gate is less than or equal to a line width of the second sub-gate.

In some embodiments, the above display substrate provided by the embodiments of the present disclosure further includes a gate line located on one side of the active layer away from a layer where the data line is located, and an orthographic projection of at least part of the first via hole on the base substrate is located in an orthographic projection of the gate line on the base substrate.

In some embodiments, in the above display substrate provided by the embodiments of the present disclosure, the transfer electrode includes a first transfer electrode and a second transfer electrode which are arranged in layers, a material of the first transfer electrode is metal, a material of the second transfer electrode is a transparent conductive oxide, an orthographic projection of the first transfer electrode on the base substrate and the orthographic projection of the gate line on the base substrate do not overlap each other, and an orthographic projection of the second transfer electrode on the base substrate partially overlaps the orthographic projection of the gate line on the base substrate.

In some embodiments, the above display substrate provided by the embodiments of the present disclosure further includes an interlayer dielectric layer disposed between a layer where the transfer electrode is located and a layer where the gate is located, and a gate insulation layer disposed between the layer where the gate is located and the active layer, the interlayer dielectric layer and the gate insulation layer include second via holes penetrating to each other, and the transfer electrode is connected with the active layer through the second via holes.

In some embodiments, the above display substrate provided by the embodiments of the present disclosure further includes a second electrode located on a side of a layer where the first electrode is located away from the planarization layer.

In some embodiments, in the above display substrate provided by the embodiments of the present disclosure, a material of the active layer is one or more of polycrystalline silicon and a metal oxide.

On the other hand, the embodiments of the present disclosure provide a display panel, including the above display substrate provided by the embodiments of the present disclosure.

In some embodiments, the above display panel provided by the embodiments of the present disclosure includes an opposite substrate arranged opposite to the display substrate, and a liquid crystal layer located between the display substrate and the opposite substrate.

On the other hand, the embodiments of the present disclosure provide a display apparatus, including the above display panel provided by the embodiments of the present disclosure.

DETAILED DESCRIPTION OF THE EMBODIMENTS

In order to make the objective, technical solutions and advantages of the embodiments of the present disclosure clearer, the technical solutions of the embodiments of the present disclosure will be described clearly and completely with reference to accompanying drawings of the embodiments of the present disclosure. It should be noted that sizes and shapes of all graphs in the accompanying drawings do not reflect the true scale, and only intend to illustrate the content of the present disclosure. The same or similar reference numbers represent the same or similar elements or elements with the same or similar functions from beginning to end. In order to keep the following description of the embodiments of the present disclosure clear and concise, the present disclosure omits detailed descriptions of well-known functions and well-known components.

Unless otherwise defined, the technical or scientific terms used here shall have the usual meanings understood by a person of ordinary skill in the art to which the present disclosure pertains. The words "first", "second" and the like used in the specification and claims of the present disclosure do not indicate any order, quantity or importance, but are only used to distinguish different components. The word "including" or "containing" and the like, means that an element or item preceding the word covers an element or item listed after the word and the equivalent thereof, without excluding other elements or items. The words "inner", "outer", "up", "down" and the like are only used to indicate the relative positional relationship. When the absolute position of the described object changes, the relative positional relationship may also change accordingly.

At present, a liquid crystal display apparatus is dominated by a transistor (TFT) liquid crystal display apparatus. However, with continuous improvement of a resolution (PPI) of the transistor liquid crystal display apparatus, more transistors need to be arranged in a display region (AA). Position arrangement of the transistors has become a key factor affecting a pixel opening rate. Because backlight of the liquid crystal display apparatus will affect device characteristics of the transistor itself, a light-shading (LS) layer needs to be added under the transistor. In order to better block light, an area of the light-shading layer should be greater than the transistor itself, which leads to a further decrease in the pixel opening rate.

Figure 1:
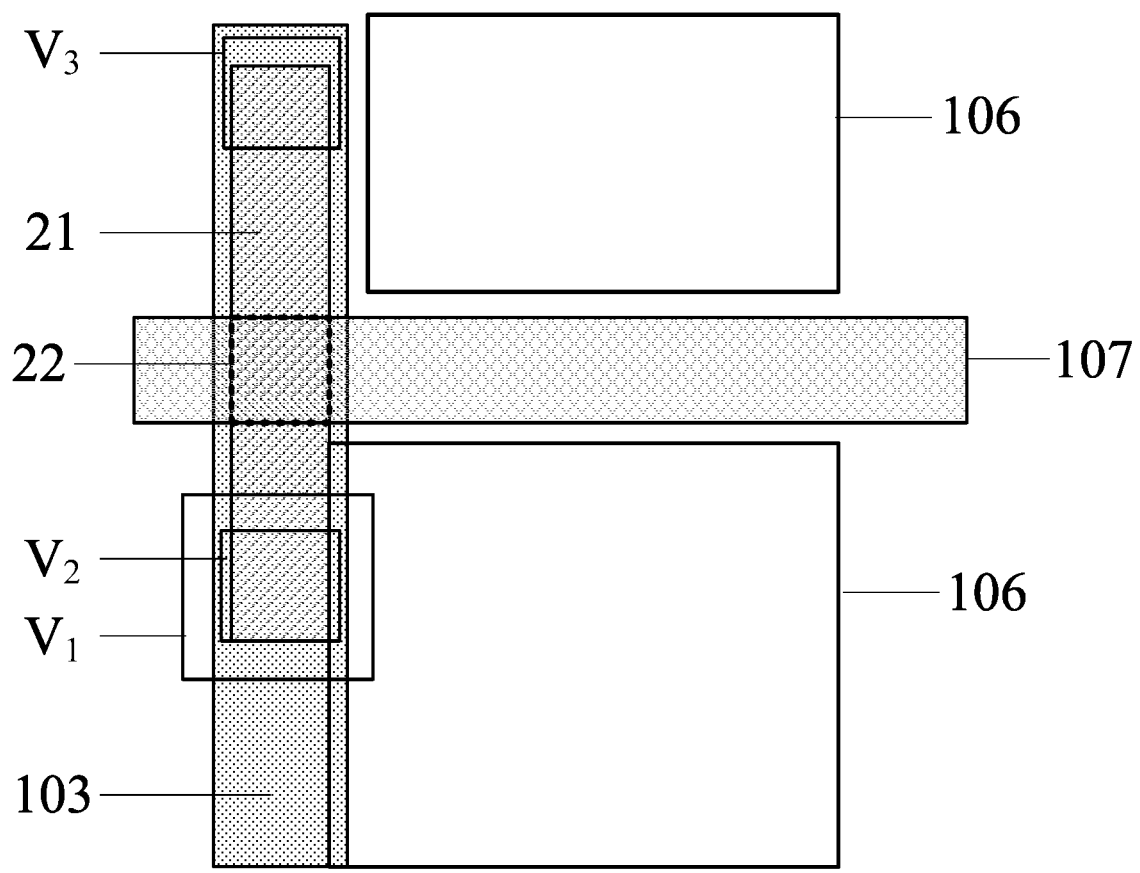
FIG. 1 is a schematic structural diagram of a display substrate provided by an embodiment of the present disclosure.
Figure 2:
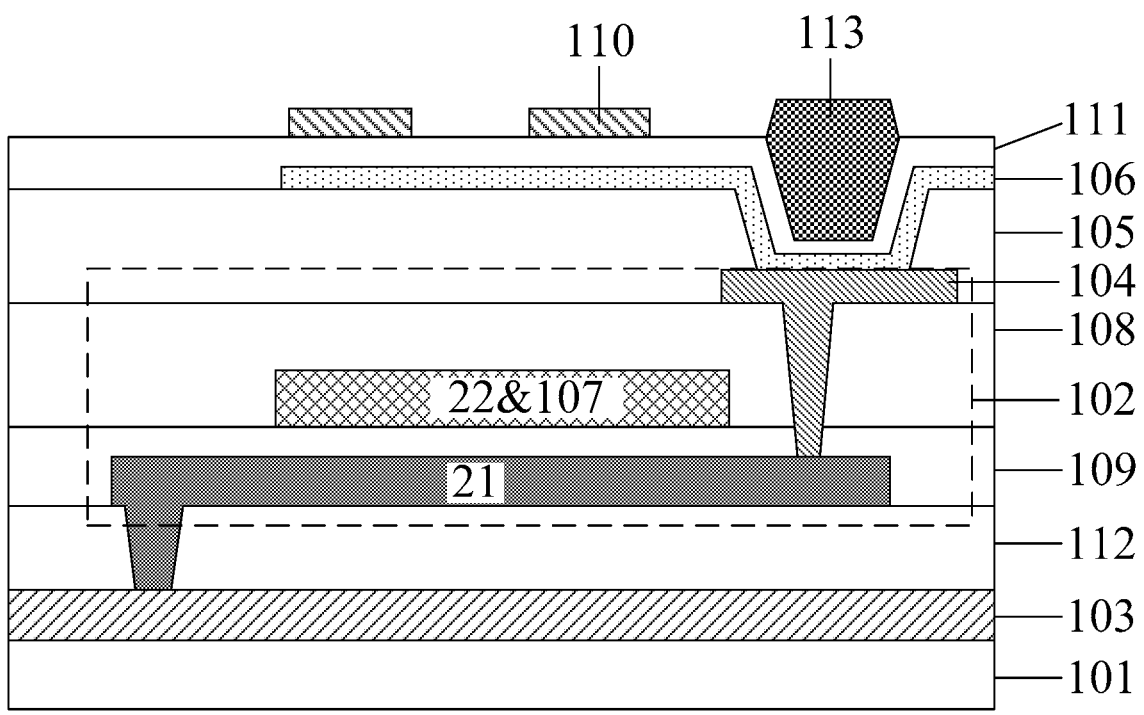
FIG. 2 is another schematic structural diagram of a display substrate provided by an embodiment of the present disclosure.

In order to improve the above problem existing in the related art, embodiment of the present disclosure provide a display substrate, as shown in FIG. 1 and FIG. 2, including:
 a base substrate 101;
 a transistor 102, located on the base substrate 101, and including an active layer 21, wherein a material of the active layer 21 is one or more of polycrystalline silicon and metal oxides, optionally, the metal oxides may be any one or more of indium gallium zinc oxide (IGZO), amorphous or polycrystalline zinc oxide (ZnO), indium zinc oxide (IZO), zinc tin oxide (ZTO), tin zinc oxide (IZTO), gallium zinc tin oxide (IGZTO), and indium gallium oxide (IGO); and
 a data line 103, located between the active layer 21 and the base substrate 101, wherein the data line 103 is connected with the active layer 21, and an orthographic projection of the active layer 21 on the base substrate 101 is located in an orthographic projection of the data line 103 on the base substrate 101.

In the above display substrate provided by the embodiments of the present disclosure, by arranging the active layer 21 above the data line 103 and ensuring that the orthographic projection of the active layer 21 on the base substrate 101 is located in the orthographic projection of the data line 103 on the base substrate 101, the data line 103 may effectively block backlight, which is equivalent to the data line 103 having a function of a light-shading layer, thus avoiding separate and additional arrangement of the light-shading layer and increasing a pixel opening rate.

Optionally, a material of the data line 103 may include a metal material, such as a single-layer or multi-layer structure formed by molybdenum, aluminum, titanium, copper, an alloy, and the like. Exemplarily, the data line 103 is a laminated structure composed of a titanium layer/an aluminum layer/a titanium layer.

In some embodiments, the above display substrate provided by the embodiments of the present disclosure, as shown in FIG. 1 and FIG. 2, may further include a transfer electrode 104, a planarization layer 105 and a first electrode 106 which are arranged sequentially on a side of a layer where the transistor 102 is located away from the base substrate 101, the planarization layer 105 includes a first via hole $V_1$, the first electrode 106 is connected with the transfer electrode 104 through the first via hole $V_1$, the transfer electrode 104 is connected with the active layer 21, a material of the active layer 21 includes polycrystalline silicon (P—Si), and a material of the transfer electrode 104 includes a metal material. The metal material will not change properties of the polycrystalline silicon, so stable performance of the active layer 21 may be ensured.

In some embodiments, in the above display substrate provided by the embodiments of the present disclosure, the planarization layer 105 may be made of an organic insulating material. Affected by the properties of the organic insulating material itself, an aperture of the first via hole $V_1$ is greater than a line width of the data line 103. Therefore, part of the first via hole $V_1$ exceeds the data line 103 and cannot be blocked by the data line 103, which will lead to light leakage in the part of the first via hole $V_1$ not blocked by the data line 103.

Figure 3:
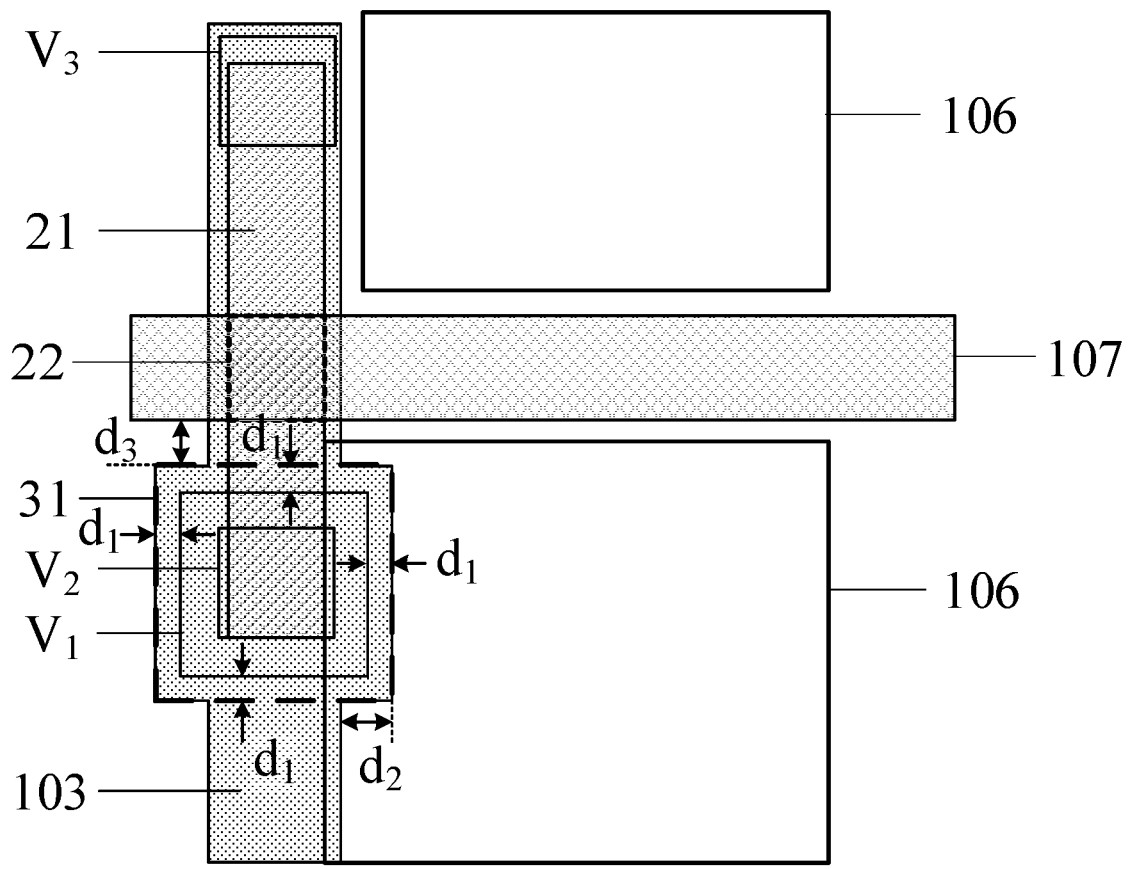
FIG. 3 is another schematic structural diagram of a display substrate provided by an embodiment of the present disclosure.

In order to solve a light leakage problem of the first via hole $V_1$, as shown in FIG. 3, the data line 103 of the present disclosure is provided with a widening part 31 at a position corresponding to the first via hole $V_1$. An orthographic projection of the widening part 31 on the base substrate 101 covers an orthographic projection of the first via hole $V_1$ on the base substrate 101, that is, an area of the orthographic projection of the widening part 31 on the base substrate 101 is greater than or equal to an area of the orthographic projection of the first via hole $V_1$ on the base substrate 101. In other words, the orthographic projection of the first via hole $V_1$ on the base substrate 101 is located in the orthographic projection of the widening part 31 on the base substrate 101, or the orthographic projection of the first via hole $V_1$ on the base substrate 101 coincides with the orthographic projection of the widening part 31 on the base substrate 101.

Optionally, as shown in FIG. 3, a distance $d_1$ between a boundary of the orthographic projection of the first via hole $V_1$ on the base substrate 101 and a boundary of the orthographic projection of the widening part 31 on the base substrate 101 is greater than or equal to 0 and less than or equal to 3 μm, for example, 0 μm, 0.5 μm, 1 μm, 1.5 μm, 2 μm, 2.5 μm, 3 μm and the like. In a direction perpendicular to the data line 103, a distance $d_2$ of the widening part 31 beyond the data line 103 on one side is greater than or equal to 0.5 μm and less than or equal to 1.5 μm, for example, 0.5 μm, 1 μm, 1.5 μm and the like. Optionally, a gate line 107 may further be arranged on a side of the active layer 21 away from a layer where the data line 103 is located. In the extension direction of the data line 103, a distance $d_3$ between the orthographic projection of the widening part 31 on the base substrate 101 and an orthographic projection of the gate line 107 on the base substrate 101 is greater than or equal to 0.3 μm and less than or equal to 1 μm, for example, 0.3 μm, 0.4 μm, 0.5 μm, 0.6 μm, 0.7 μm, 0.8 μm, 0.9 μm, 1 μm and the like. In a high-resolution product, each line width is smaller and more refined than the existing technology. The product with the higher resolution has the stricter control on each line width and a size of line spacing. In the present disclosure, the widening part 31 is arranged according to the above parameters, so that the light leakage problem of the first via hole $V_1$ can be solved without affecting the opening rate at the same time.

In some embodiments, the transfer electrode 104 including the metal material may further be adopted to block the backlight so as to solve the light leakage problem of the first via hole $V_1$. Base on this, in the present disclosure, an orthographic projection of the transfer electrode 104 on the base substrate 101 may further be made to cover the orthographic projection of the first via hole $V_1$ on the base substrate 101, that is, an area of the orthographic projection of the transfer electrode 104 on the base substrate 101 is greater than or equal to an area of the orthographic projection of the first via hole $V_1$ on the base substrate 101. In other words, the orthographic projection of the first via hole $V_1$ on the base substrate 101 is located in the orthographic projection of the transfer electrode 104 on the base substrate 101, or the orthographic projection of the first via hole $V_1$ on the base substrate 101 coincides with the orthographic projection of the transfer electrode 104 on the base substrate 101.

In some embodiments, in the above display substrate provided by the embodiments of the present disclosure, as shown in FIG. 1 to FIG. 3, the transistor 102 includes a gate 22 located on a side of the active layer 21 away from the layer where the data line 103 is located. Since the light leakage problem of the first via hole $V_1$ can be solved through the data line 103 and/or the transfer electrode 104, there is no need to use the gate 22 to solve the light leakage problem of the first via hole $V_1$. Based on this, an orthographic projection of the gate 22 on the base substrate 101 and the orthographic projection of the first via hole $V_1$ on the base substrate 101 may not overlap each other. Certainly, in some embodiments, the orthographic projection of the gate 22 on the base substrate 101 and the orthographic projection of the first via hole $V_1$ on the base substrate 101 may further overlap each other to improve poor light leakage of the first via hole $V_1$ to a certain extent through the gate 22.

Optionally, in order to avoid mutual interference due to the formation of parasitic capacitance between the transfer electrode 104 and the gate 22, as shown in FIG. 1 to FIG. 3, the orthographic projection of the gate 22 on the base substrate 101 and the orthographic projection of the transfer electrode 104 on the base substrate 101 may not overlap each other. In some embodiments, the gate 22 may be multiplexed with the gate line 107, the data line 103 may be multiplexed with a source of the transistor 102, and the transfer electrode 104 may be multiplexed with a drain of the transistor. Alternatively, the data line 103 is multiplexed with the drain of the transistor 102, and the transfer electrode 104 is multiplexed with the source of the transistor.

Figure 4:
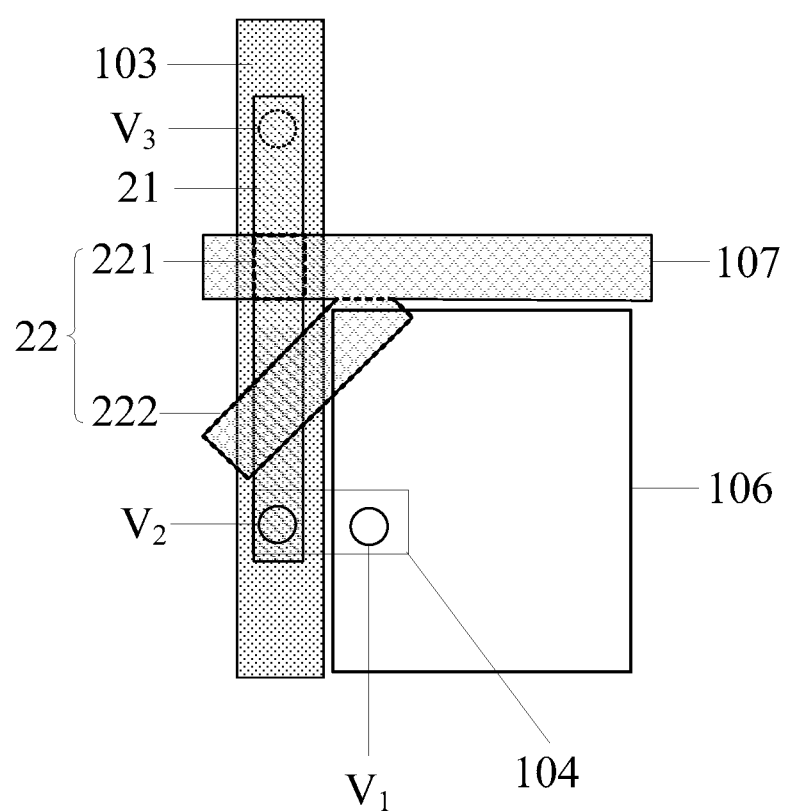
FIG. 4 is another schematic structural diagram of a display substrate provided by an embodiment of the present disclosure.
Figure 5:
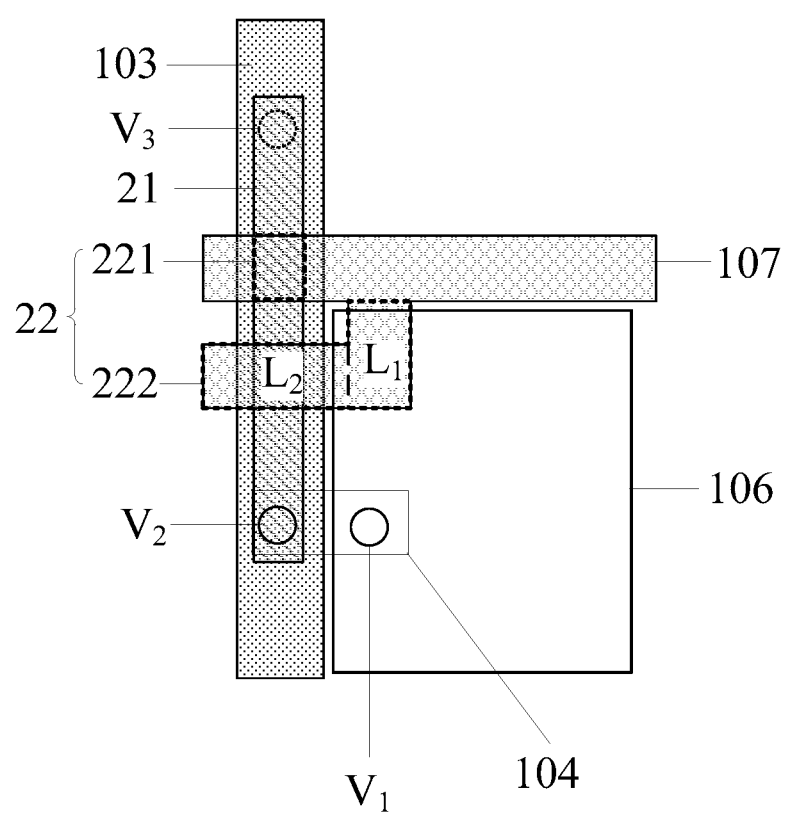
FIG. 5 is another schematic structural diagram of a display substrate provided by an embodiment of the present disclosure.
Figure 6:
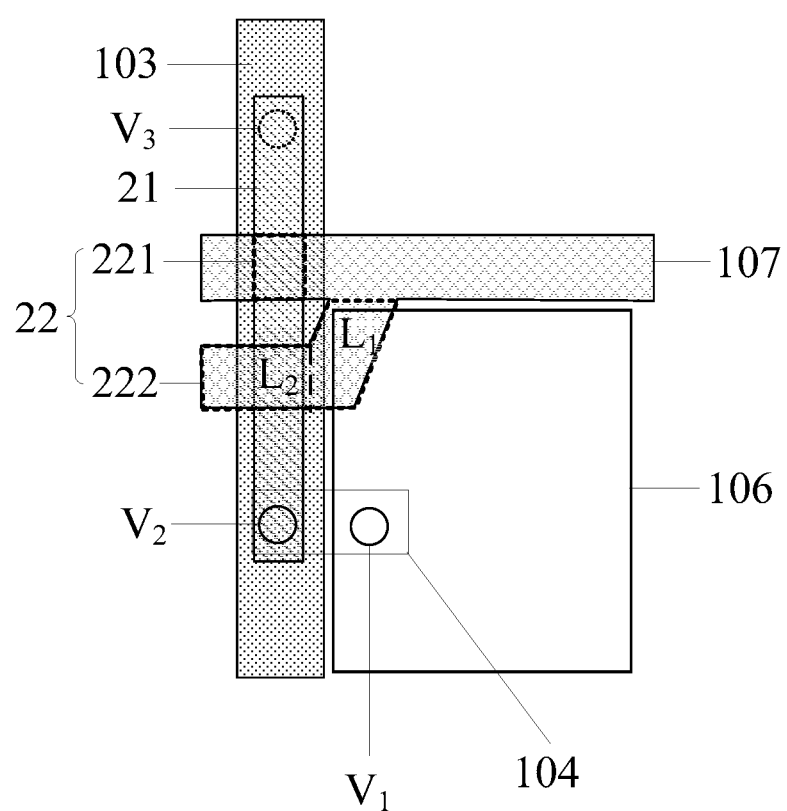
FIG. 6 is another schematic structural diagram of a display substrate provided by an embodiment of the present disclosure.

In the related art, the active layer 21 is of a U-shaped structure that does not overlap with the data line 103 and has a large area, which affects the pixel opening rate. It can be seen from FIG. 1 and FIG. 3 that the active layer 21 in the present disclosure is of a strip structure located in the orthographic projection of the data line 103, which can effectively increase the pixel opening rate. Optionally, in order to enhance a gate control capability, the present disclosure may further arrange the transistor 102 as a double-gate transistor. As shown in FIG. 4 to FIG. 6, the gate 22 includes a first gate 221 and a second gate 222 with orthographic projections overlapping with the active layer 21 having a strip structure, and the first gate 221 is multiplexed with the gate line 107, and the second gate 222 and the gate line 107 intersect and are arranged integrally. That is, the first gate 221 and the second gate 222 form a bifurcated double-gate.

In some embodiments, in the above display substrate provided by the embodiments of the present disclosure, as shown in FIG. 4, an included angle between the second gate 222 and the gate line 107 is an acute angle. Or, as shown in FIG. 5 and FIG. 6, the second gate 222 includes a first sub-gate $L_1$ and a second sub-gate $L_2$, the first sub-gate $L_1$ connects the second sub-gate $L_2$ with the gate line 107, an included angle between the first sub-gate $L_1$ and the gate line 107 is greater than 0° and less than or equal to 90°, and the second sub-gate $L_2$ and the gate line 107 are arranged parallelly. Certainly, during implementation, the second gate 222 may further have other structures, which will not be specifically defined here.

In some embodiments, in the above display substrate provided by the embodiments of the present disclosure, a line width of the first sub-gate $L_1$ may be equal to a line width of the second sub-gate $L_2$. In order to further increase the pixel opening rate, the line width of the first sub-gate $L_1$ may be less than the line width of the second sub-gate $L_2$. For example, the line width of the first sub-gate $L_1$ is greater than or equal to 0.5 μm and less than or equal to 3 μm (for example, 0.5 μm, 1 μm, 1.5 μm, 2 μm, 2.5 μm, 3 μm and the like), and the line width of the second sub-gate $L_2$ is greater than or equal to 1 μm and less than or equal to 3 μm (for example, 1 μm, 1.5 μm, 2 μm, 2.5 μm, 3 μm and the like).

Figure 7:
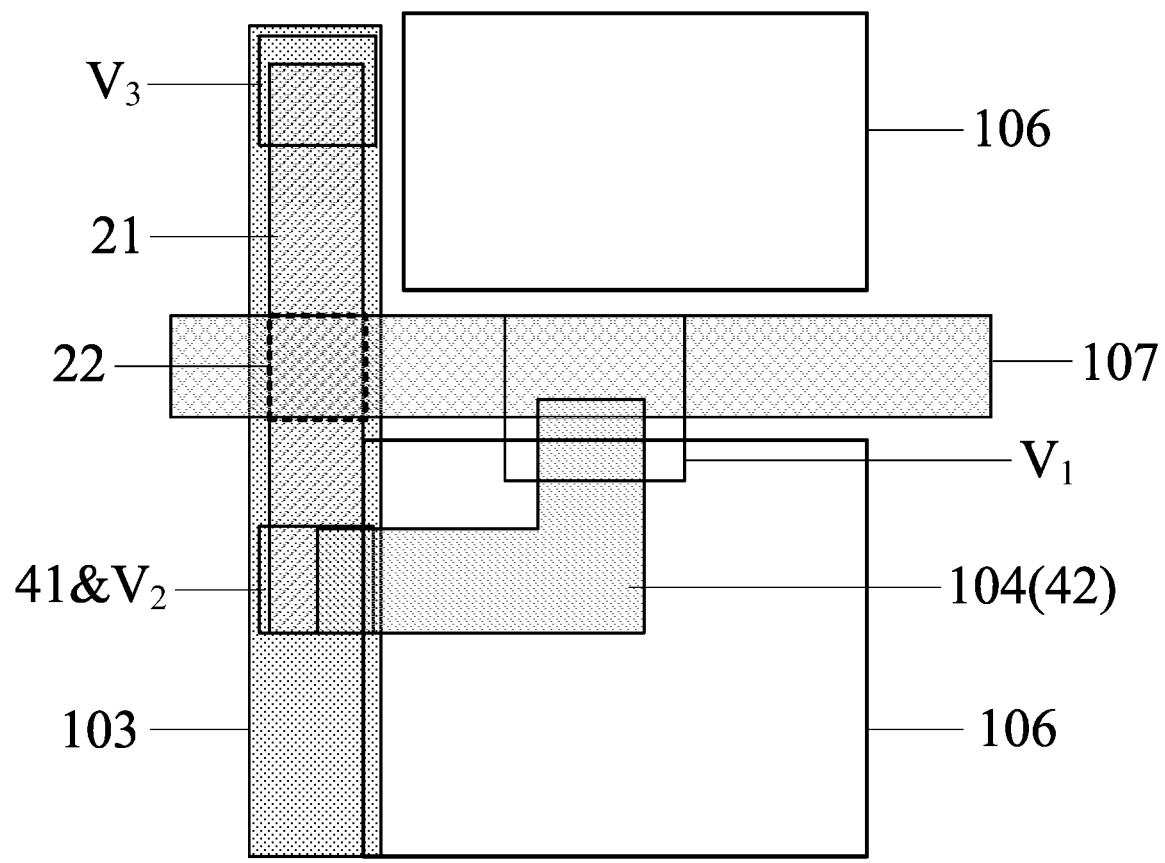
FIG. 7 is another schematic structural diagram of a display substrate provided by an embodiment of the present disclosure.
Figure 8:
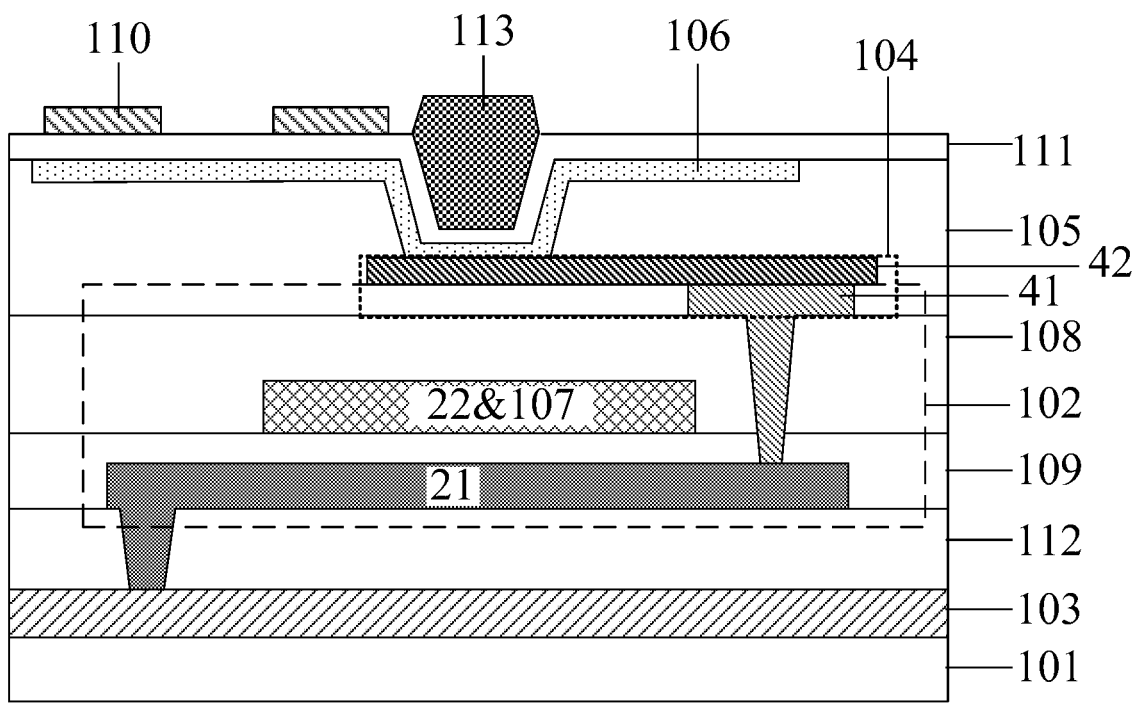
FIG. 8 is another schematic structural diagram of a display substrate provided by an embodiment of the present disclosure.

In some embodiments, in the above display substrate provided by the embodiments of the present disclosure, as shown in FIG. 7 and FIG. 8, it may further be set that an orthographic projection of at least part of the first via hole $V_1$ on the base substrate 101 is located in the orthographic projection of the gate line 107 on the base substrate 101. Optionally, the orthographic projection of the first via hole $V_1$ on the base substrate 101 is located in the orthographic projection of the gate line 107 on the base substrate 101 to block the backlight through the gate line 107, thereby avoiding light leakage at the first via hole $V_1$. In this case, as shown in FIG. 7 and FIG. 8, the transfer electrode 104 may be arranged to include a first transfer electrode 41 and a second transfer electrode 42 which are arranged in a stacked mode. A material of the first transfer electrode 41 is metal (such as molybdenum, aluminum, titanium, copper, and an alloy), and a material of the second transfer electrode 42 is a transparent conductive oxide (such as indium tin oxide, and indium zinc oxide). An orthographic projection of the first transfer electrode 41 on the base substrate 101 and the orthographic projection of the gate line 107 on the base substrate 101 do not overlap each other, and an orthographic projection of the second transfer electrode 42 on the base substrate 101 partially overlaps with the orthographic projection of the gate line 107 on the base substrate 101, to support the first via hole $V_1$ with the orthographic projection overlapping with the gate line 107 through the second transfer electrode 42. Compared with a solution that the first transfer electrode 41 made of the metal material is adopted to support the first via hole $V_1$, the solution that the second transfer electrode 42 made of the transparent conductive oxide material supports the first via hole $V_1$ can effectively increase the pixel opening rate.

In some embodiments, the above display substrate provided by the embodiments of the present disclosure, as shown in FIG. 1 to FIG. 8, may further include an interlayer dielectric layer 108 disposed between a layer where the transfer electrode 104 is located and a layer where the gate 22 is located, and a gate insulation layer 109 disposed between the layer where the gate 22 is located and the active layer 21, the interlayer dielectric layer 108 and the gate insulation layer 109 include second via holes $V_2$ penetrating to each other, and the transfer electrode 104 is connected with the active layer 21 through the second via holes $V_2$. Optionally, materials of both the interlayer dielectric layer 108 and the gate insulating layer 109 may be inorganic insulating materials such as silicon oxide, silicon nitride, and silicon oxynitride, so that the second via holes $V_2$ penetrating through the interlayer dielectric layer 108 and the gate insulating layer 109 may be formed through a single mask patterning process.

In some embodiments, the above display substrate provided by the embodiments of the present disclosure, as shown in FIG. 2 and FIG. 8, may further include a second electrode 110 located on a side of a layer where the first electrode 106 is located away from the planarization layer 105, and an orthographic projection of the second electrode 110 on the base substrate 101 at least partially overlaps with an orthographic projection of the first electrode 106 on the base substrate 101. The data line 103 in the related art is disposed between the layer where the gate 22 is located and the layer where the transfer electrode 104 is located, and the data line 103 in the present disclosure is located between the active layer 21 and the base substrate 101. Therefore, compared with the related art, a distance between the layer where the data line 103 is located and the layer where the second electrode 110 is located in the present disclosure is large, which can effectively reduce the parasitic capacitance between the data line 103 and the second electrode 110, thereby significantly reducing power consumption.

Optionally, the present disclosure is applicable to a liquid crystal display product. At this time, the first electrode 106 is a pixel electrode, the second electrode 110 is a common electrode, the common electrode may be a slit electrode, and an inorganic insulating layer 111 may further be arranged between the first electrode 106 and the second electrode 110. Alternatively, the present disclosure is applicable to an organic light-emitting display product. At this time, the first electrode 106 may be an anode, the second electrode 110 may be a cathode, and a light-emitting functional layer is arranged between the first electrode 106 and the second electrode 110, so that the first electrode 106, the second electrode 110 and the light-emitting functional layer together constitute a light-emitting device (such as an organic light-emitting device (OLED)), where the light-emitting functional layer includes, but is not limited to a hole injection layer, a hole transport layer, an electron blocking layer, a light-emitting material layer, a hole blocking layer, an electron transport layer and an electron injection layer.

Accordingly, the embodiments of the present disclosure further provide a method for manufacturing the above display substrate. Illustration is made below by taking the display substrate shown in FIG. 2 as an example. The manufacturing process is as follows.

Figure 9:
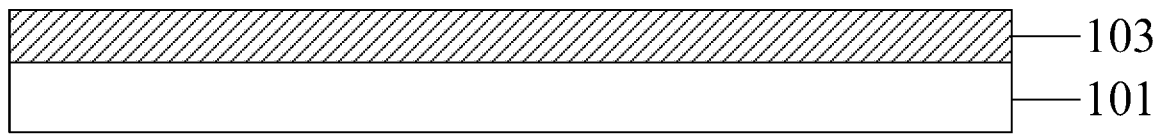
FIG. 9 is a schematic structural diagram of a display substrate shown in FIG. 2 in a manufacturing process.

First step, a source-drain metal layer with a thickness of 2000 Å-8000 Å is formed on a base substrate 101, and a data line 103 is formed after patterning the source-drain metal layer, as shown in FIG. 9.

Figure 10:
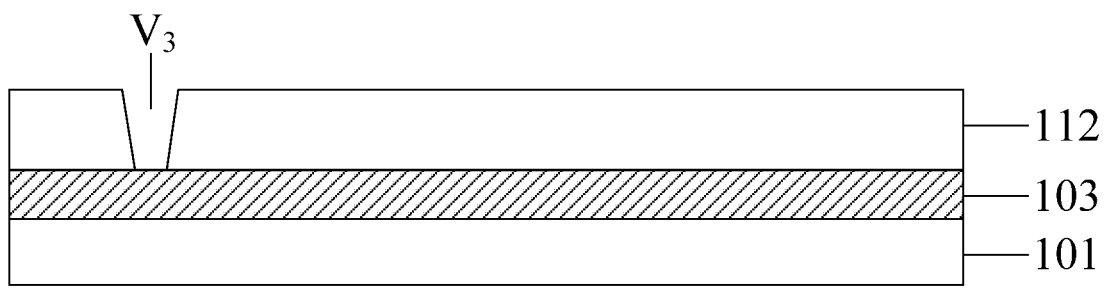
FIG. 10 is another schematic structural diagram of a display substrate shown in FIG. 2 in a manufacturing process.

Second step, a silicon nitride layer with a thickness of 300 Å-2000 Å and a silicon oxide layer with a thickness of 1000 Å-4000 Å are sequentially formed on a layer where the data line 103 is located, and the silicon nitride layer and the silicon oxide layer which are arranged in a stacked mode are patterned, and a third via hole $V_3$ used to connect the data line 103 and an active layer 21 to be manufactured is formed to obtain a buffer layer 112, as shown in FIG. 10.

Figure 11:
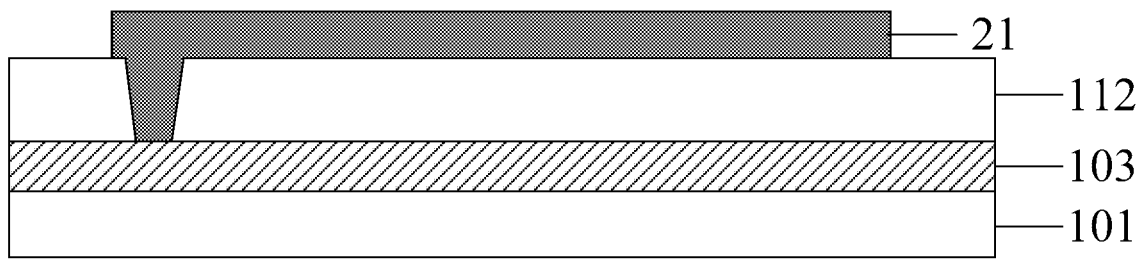
FIG. 11 is another schematic structural diagram of a display substrate shown in FIG. 2 in a manufacturing process.

Third step, an amorphous silicon layer is formed on the buffer layer 112, and the amorphous silicon layer is crystallized, so that the amorphous silicon layer is converted into an intrinsic polycrystalline silicon layer, then the intrinsic polycrystalline silicon layer is patterned to form the active layer 21 which is in lap joint with the data line 103 through the third via hole $V_3$, and an orthographic projection of the active layer 21 on the base substrate 101 falls into the orthographic projection of the data line 103 on the base substrate 101, as shown in FIG. 11. Optionally, photoresist (PR) is further adopted to block a channel region of the polycrystalline silicon active layer 21, and n-type doping is performed on a source region and drain region of the exposed polycrystalline silicon active layer 21, so that intrinsic polycrystalline silicon in the source region and the drain region is converted into conductive n-type polycrystalline silicon, thereby improving a connection effect of the active layer 21 and the data line 103.

Figure 12:
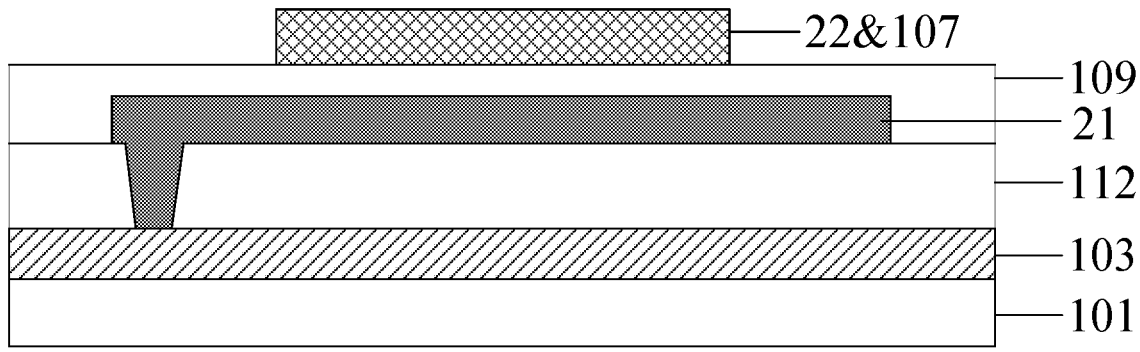
FIG. 12 is another schematic structural diagram of a display substrate shown in FIG. 2 in a manufacturing process.

Fourth step, a gate insulation layer 109 and a gate metal layer are sequentially formed on the active layer 21, and the gate metal layer is patterned to form a gate 22 located above the active layer 21, as shown in FIG. 12.

Figure 13:
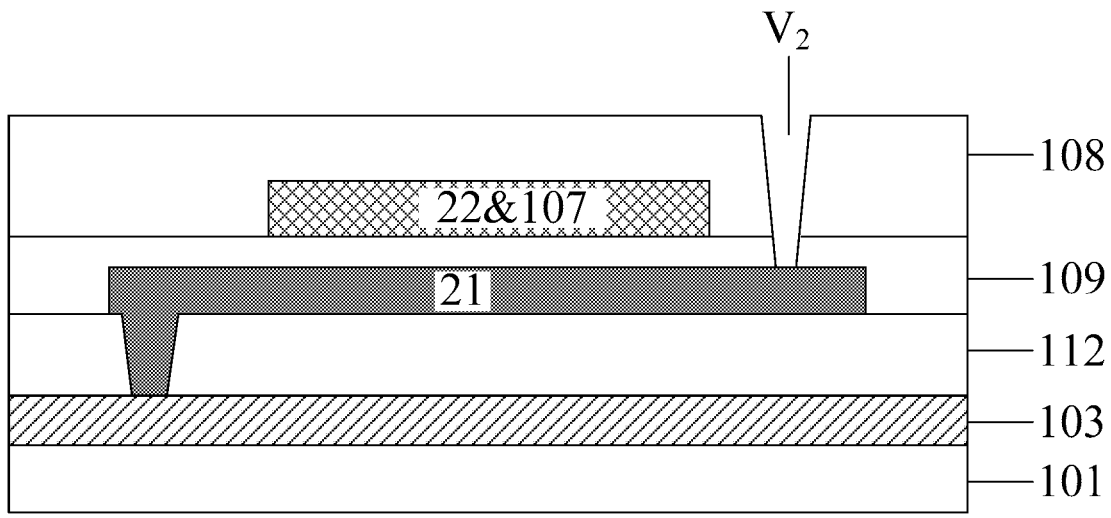
FIG. 13 is another schematic structural diagram of a display substrate shown in FIG. 2 in a manufacturing process.

Fifth step, an interlayer dielectric layer 108 is formed on a layer where the gate 22 is located, and the interlayer dielectric layer 108 and the gate insulation layer 109 have second via holes $V_2$ formed in a penetrating mode, as shown in FIG. 13.

Figure 14:
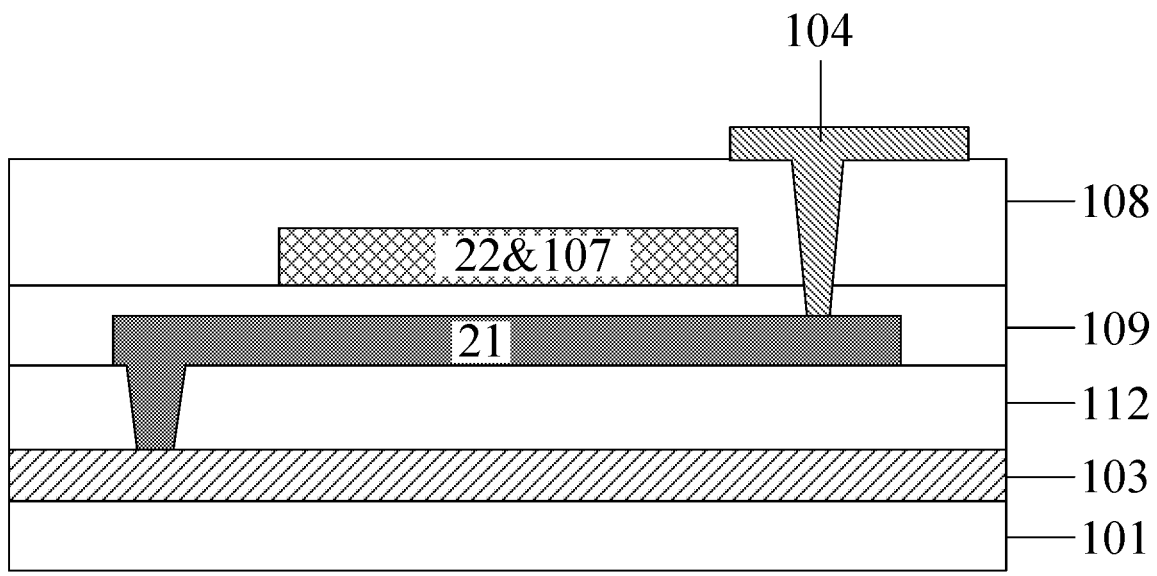
FIG. 14 is another schematic structural diagram of a display substrate shown in FIG. 2 in a manufacturing process.

Sixth step, a transfer metal layer is formed on the interlayer dielectric layer 108, and a transfer electrode 104 is formed after patterning the transfer metal layer, so that the transfer electrode 104 is connected with the active layer 21 through the second via holes $V_2$, and the transfer electrode 104 may be reused as a source or drain of a transistor 102, as shown in FIG. 14.

Figure 15:
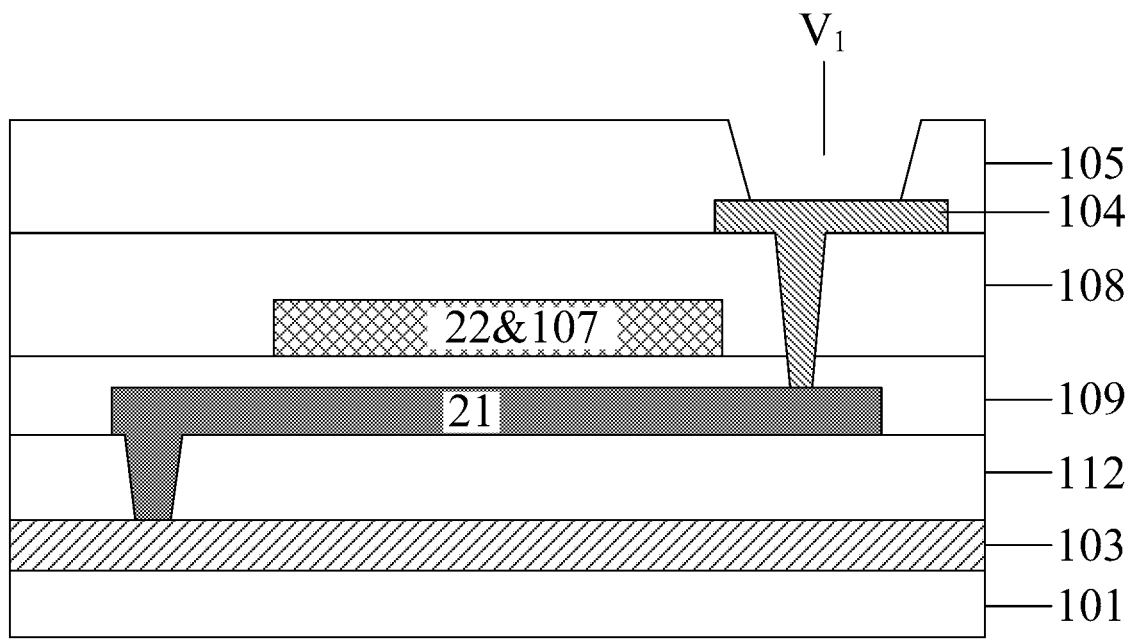
FIG. 15 is another schematic structural diagram of a display substrate shown in FIG. 2 in a manufacturing process.

Seventh step, a planarization layer 105 is formed on a layer where the transfer electrode 104 is located, and the planarization layer 105 has a first via hole $V_1$ located in a widening part 31 of the data line 103, as shown in FIG. 15.

Figure 16:
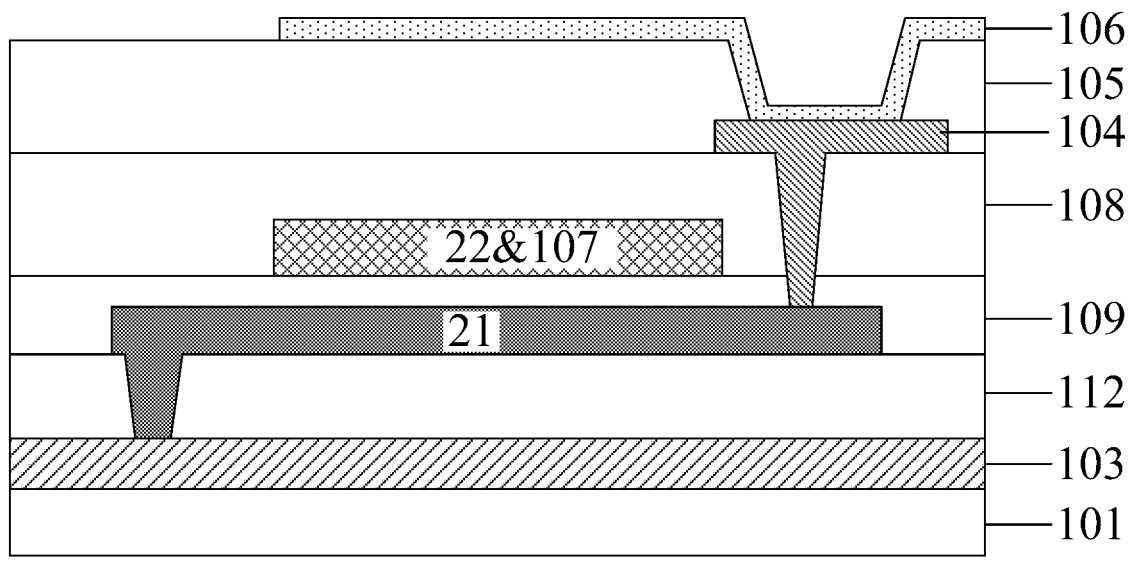
FIG. 16 is another schematic structural diagram of a display substrate shown in FIG. 2 in a manufacturing process.

Eighth step, a transparent conductive layer is formed on the planarization layer 105, and a first electrode 106 is formed after patterning the transparent conductive layer, so that the first electrode 106 is connected with the transfer electrode 104 through the first via hole $V_1$, as shown in FIG. 16.

Figure 17:
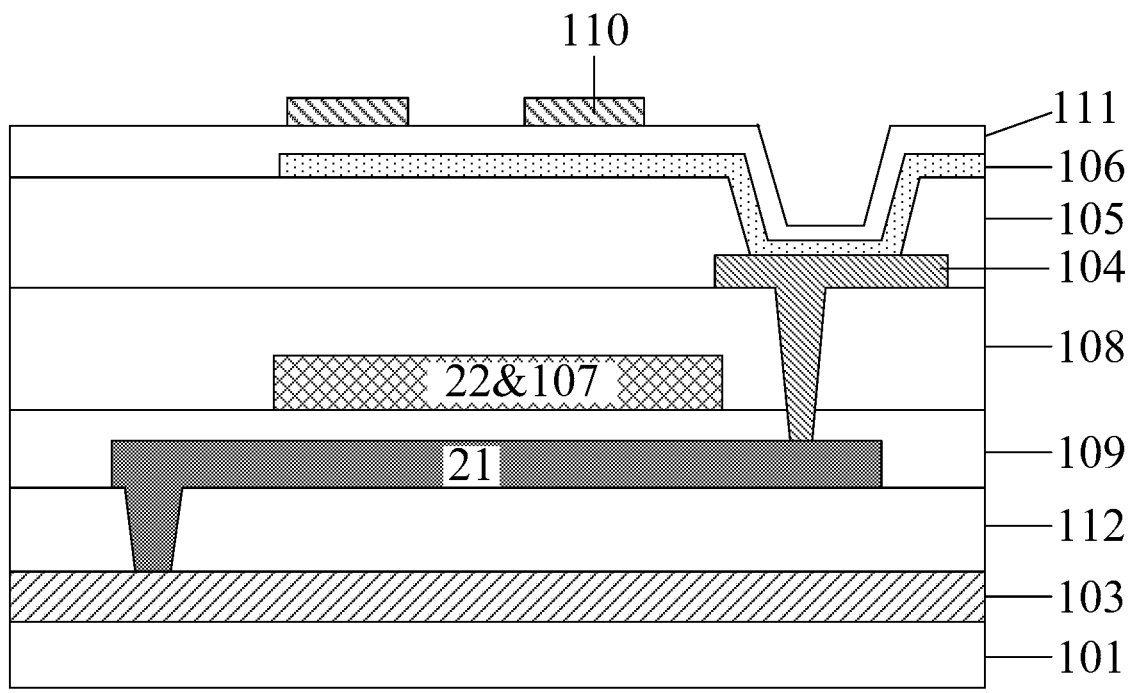
FIG. 17 is another schematic structural diagram of a display substrate shown in FIG. 2 in a manufacturing process.

Ninth step, an inorganic insulating layer 111 and a transparent conductive layer are sequentially formed on a layer where the first electrode 106 is located, and the transparent conductive layer is patterned to form a second electrode 110 with an orthogonal projection at least partially overlapping with the first electrode 106, as shown in FIG. 17.

Tenth step, a filling structure 113 is formed at the first via hole $V_1$ to improve the flatness at the first via hole $V_1$, as shown in FIG. 2.

Based on the same inventive concept, the embodiments of the present disclosure further provide a display panel, including the above display substrate provided by the embodiments of the present disclosure. Principles of the display panel for solving the problems are similar to that of the above display substrate, therefore, implementation of the display panel provided by the embodiments of the present disclosure may refer to that of the above display substrate, and repetitions are omitted.

In some embodiments, the above display panel provided by the embodiments of the present disclosure may be an organic light-emitting display panel or a liquid crystal display panel. The liquid crystal display panel may include a display substrate and an opposite substrate which are arranged oppositely, and a liquid crystal layer located between the display substrate and the opposite substrate. In the present disclosure, illustration is made by taking an example that a first electrode 106 and a second electrode 110 are both arranged on the display substrate. In some embodiments, the second electrode 110 may also be arranged on the opposite substrate.

Based on the same inventive concept, the embodiments of the present disclosure further provides a display apparatus, including the above display panel provided by the embodiments of the present disclosure. Principles of the display apparatus for solving the problems are similar to that of the above display panel, therefore, implementation of the display apparatus provided by the embodiments of the present disclosure may refer to that of the above display panel, and repetitions are omitted.

In some embodiments, the above display apparatus provided by the embodiments of the present disclosure may be: any product or component with a display function, such as a mobile phone, a tablet computer, a television, a displayer, a notebook computer, a digital photo frame, a navigator, a smart watch, a fitness wristband and a personal digital assistant. The display apparatus includes but not limited to: a radio frequency unit, a network module, an audio output and input unit, a sensor, a display unit, a user input unit, an interface unit, a memory, a processor, a power supply and other components. In addition, those skilled in the art can understand that the above structure does not constitute a limitation of the above display apparatus provided by the embodiments of the present disclosure. In other words, the above display apparatus provided by the embodiments of the present disclosure may include more or fewer above components, or combine some components, or different component arrangements.

Although the preferred embodiments have been described in the present disclosure, it should be understood that those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent art, the present disclosure also intends to include these modifications and variations.

What is claimed is:

1. A display substrate, comprising:
a base substrate;
a transistor, located on the base substrate, and comprising an active layer;
a data line, located between the active layer and the base substrate, wherein the data line is connected with the active layer, and an orthographic projection of the active layer on the base substrate is located in an orthographic projection of the data line on the base substrate;
a transfer electrode, a planarization layer and a first electrode which are arranged sequentially on a side of a layer where the transistor is located away from the base substrate, wherein the planarization layer comprises a first via hole, the first electrode is connected with the transfer electrode through the first via hole, the transfer electrode is connected with the active layer, and a material of the transfer electrode comprises a metal material; and
a gate line located on a side of the active layer away from a layer where the data line is located;
wherein the data line has a widening part at a position corresponding to the first via hole, and an orthographic projection of the widening part on the base substrate covers an orthographic projection of the first via hole on the base substrate;
in an extension direction of the data line, a distance between the orthographic projection of the widening part on the base substrate and an orthographic projection of the gate line on the base substrate is greater than or equal to 0.3 μm and less than or equal to 1 μm.

2. The display substrate according to claim 1, wherein a distance between a boundary of the orthographic projection of the first via hole on the base substrate and a boundary of the orthographic projection of the widening part on the base substrate is greater than or equal to 0 and less than or equal to 3 μm.

3. The display substrate according to claim 1, wherein in a direction perpendicular to the extension direction of the data line, a distance of the widening part beyond the data line on one side is greater than or equal to 0.5 μm and less than or equal to 1.5 μm.

4. The display substrate according to claim 1, wherein an orthographic projection of the transfer electrode on the base substrate covers the orthographic projection of the first via hole on the base substrate.

5. The display substrate according to claim 1, wherein the transistor comprises a gate located on a side of the active layer away from the layer where the data line is located, and an orthographic projection of the gate on the base substrate and the orthographic projection of the first via hole on the base substrate do not overlap each other; or,
wherein the transistor comprises a gate located on a side of the active layer away from the layer where the data line is located, and an orthographic projection of the gate on the base substrate partially overlaps the orthographic projection of the first via hole on the base substrate.

6. The display substrate according to claim 5, wherein the gate comprises a first gate and a second gate, the first gate is multiplexed with the gate line, and the second gate and the gate line intersect and are arranged integrally.

7. The display substrate according to claim 6, wherein an included angle between the second gate and the gate line is an acute angle.

8. The display substrate according to claim 6, wherein the second gate comprises a first sub-gate and a second sub-gate, the first sub-gate connects the second sub-gate with the gate line, an included angle between the first sub-gate and the gate line is greater than 0° and less than or equal to 90°, and the second sub-gate and the gate line are arranged parallelly.

9. The display substrate according to claim 8, wherein a line width of the first sub-gate is less than or equal to a line width of the second sub-gate.

10. The display substrate according to claim 1, wherein an orthographic projection of at least part of the first via hole on the base substrate is located in the orthographic projection of the gate line on the base substrate.

11. The display substrate according to claim 10, wherein the transfer electrode comprises a first transfer electrode and a second transfer electrode arranged in layers, a material of the first transfer electrode is metal, a material of the second transfer electrode is a transparent conductive oxide, an orthographic projection of the first transfer electrode on the base substrate and the orthographic projection of the gate line on the base substrate do not overlap each other, and an orthographic projection of the second transfer electrode on the base substrate partially overlaps the orthographic projection of the gate line on the base substrate.

12. The display substrate according to claim 5, further comprising an interlayer dielectric layer disposed between a layer where the transfer electrode is located and a layer where the gate is located, and a gate insulation layer disposed between the layer where the gate is located and the active layer, wherein the interlayer dielectric layer and the gate insulation layer comprise second via holes penetrating to each other, and the transfer electrode is connected with the active layer through the second via holes.

13. The display substrate according to claim 1, further comprising a second electrode located on a side of a layer where the first electrode is located away from the planarization layer.

14. The display substrate according to claim 1, wherein a material of the active layer is one or more of polycrystalline silicon and a metal oxide.

15. A display panel, comprising the display substrate according to claim 1.

16. The display panel according to claim 15, comprising an opposite substrate arranged opposite to the display substrate, and a liquid crystal layer disposed between the display substrate and the opposite substrate.

17. A display apparatus, comprising the display panel according to claim 15.

* * * * *